(12) United States Patent
Hasegawa

(10) Patent No.: US 6,552,747 B1
(45) Date of Patent: Apr. 22, 2003

(54) SOLID STATE IMAGE PICKUP DEVICE

(75) Inventor: Jun Hasegawa, Miyagi (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/311,291

(22) Filed: May 14, 1999

(30) Foreign Application Priority Data

May 18, 1998 (JP) .......................... 10-135412

(51) Int. Cl.7 .............................................. H04N 5/335
(52) U.S. Cl. ...................... 348/314; 348/294; 348/273
(58) Field of Search ................................. 348/294, 300, 348/301, 302, 307, 308, 309, 311, 299, 241, 272, 273, 280, 281, 314, 315, 316; 358/513, 514, 515, 517, 506, 533, 75, 44; 250/578, 208.1

(56) References Cited

U.S. PATENT DOCUMENTS

| | | | | |
|---|---|---|---|---|
| 5,027,195 A | * | 6/1991 | Cooley et al. ............... | 358/500 |
| 5,757,520 A | * | 5/1998 | Takashima ................... | 358/513 |
| 6,153,874 A | * | 11/2000 | Monoi ...................... | 250/208.1 |
| 6,166,831 A | * | 12/2000 | Boyd et al. ................. | 358/483 |

* cited by examiner

Primary Examiner—Tuan Ho
(74) Attorney, Agent, or Firm—Sunghrue Mion, PLLC

(57) ABSTRACT

A solid state image pickup device includes: a photoelectric conversion element line having a plurality of first and second photoelectric conversion elements disposed alternately, the first and second photoelectric conversion elements being sensitive to light of different colors; first and second charge storage area lines for storing electric charges photoelectrically converted by the first and second photoelectric conversion elements; first and second charge read units for reading the electric charges stored in the first and second charge storage area lines; first and second transfer members for sequentially transferring the read electric charges to an external circuit; and first and second charge drain members for draining electric charges in the first and second charge storage members.

29 Claims, 12 Drawing Sheets

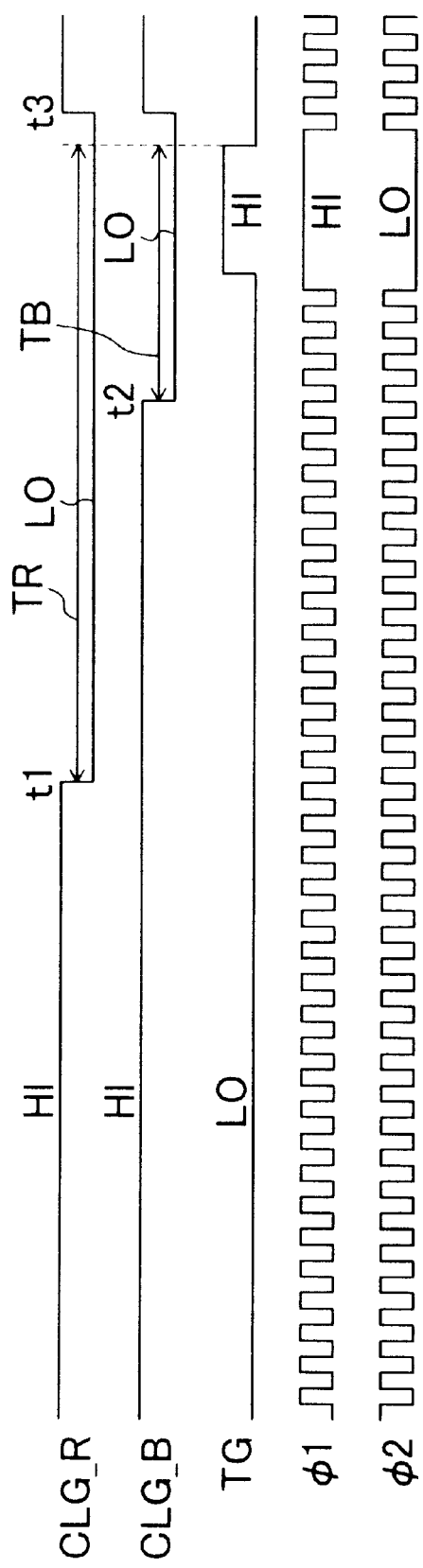

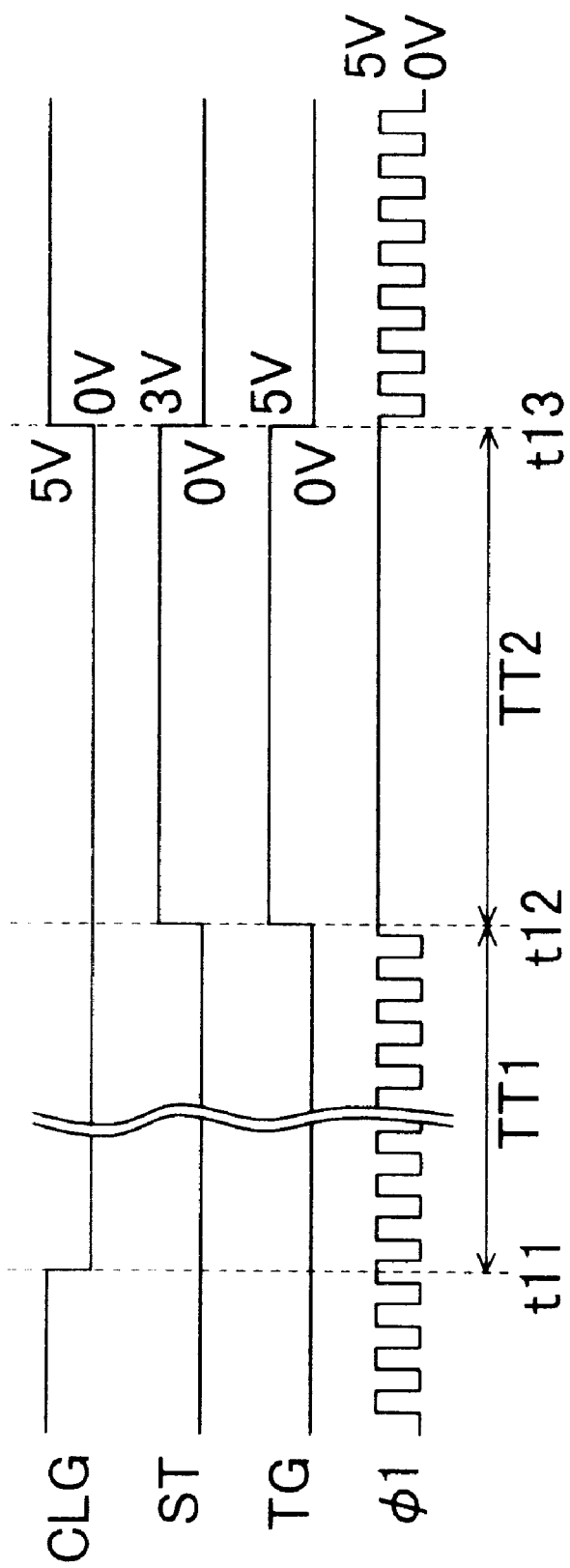

SOLID STATE IMAGE PICKUP DEVICE

This application is based on Japanese patent application No. 10-135412 filed on May 18, 1998, the entire contents of which are incorporated herein by reference.

BACKGROUND OF THE INVENTION a) Field of the Invention

The present invention relates to a solid state image pickup device for converting an optical signal into an electrical signal, and more particularly to a solid state image pickup device capable of being used with an image scanner.

b) Description of the Related Art

A line sensor device having a green channel (G-ch) line sensor and a red/blue channel (R/B-ch) line sensor is known, which can pick up color image information as electrical signals. The G-ch line sensor of this line sensor device is used for picking up mainly a luminance signal, whereas the R/B-ch line sensor is used for picking up mainly color signals. Since a resolution of the color signal lower than that of the luminance signal does not pose any serious problem, the numbers of red (R) pixels and blue (B) pixels of the R/G-ch line sensor are each set to have a half of the number of green (G) pixels of the G-channel line sensor. R and B pixels are alternately disposed in line in the R/B-ch line sensor, whereas only G pixels are consecutively disposed in line.

Red and blue color filters are alternately disposed on the pixels (light reception sensors) of the R/G-ch line sensor, whereas green color filters are consecutively disposed on the pixels of the G-ch line sensor. Both the R/B-ch and G-ch line sensors have the same structure excepting color filters.

Since the R/B-ch line sensor generates electric charges of both R and B pixels, it is necessary to set the same charge storage time or integration time to the R and B pixels.

If the color of a subject is deviated to the red side or blue side, this same integration time is not suitable for both the red and blue colors. Therefore, outputs of pixels on one channel (R-ch or B-ch) have always a lower S/N ratio than the other channel.

SUMMARY OF THE INVENTION

It is an object of the present invention to provide a solid image pickup device capable of independently controlling an integration time of each of green, red and blue pixels of a color line sensor device having G-ch and R/B-ch line sensors and realizing a high S/N ratio of each color output.

According to one aspect of the present invention, there is provided a solid state image pickup device comprising: a photoelectric conversion element line having a plurality of first and second conversion elements disposed alternately, the first and second photoelectric conversion elements converting light having different colors into electric charges; first transfer means for transferring electric charges generated by the plurality of first photoelectric conversion elements to an external circuit; a first transfer gate for transferring the electric charges generated by the plurality of first photoelectric conversion elements to the first transfer means; a first drain for draining unnecessary electric charges generated by the plurality of first photoelectric conversion elements; a first drain gate for transferring the unnecessary electric charges generated by the plurality of first photoelectric conversion elements to the first drain; second transfer means for transferring electric charges generated by the plurality of second photoelectric conversion elements to an external circuit; a second transfer gate for transferring the electric charges generated by the plurality of second photoelectric conversion elements to the second transfer means; a second drain for draining unnecessary electric charges generated by the plurality of second photoelectric conversion elements; a second drain gate for transferring the unnecessary electric charges generated by the plurality of second photoelectric conversion elements to the second drain; and a controller for independently controlling a charge transfer by the first and second transfer gates or by the first and second drain gates.

According to another aspect of the present invention, there is provided a solid state image pickup device comprising: a photoelectric conversion element line having a plurality of first and second photoelectric conversion elements disposed alternately, the first and second photoelectric conversion elements being sensitive to light of different colors; a line of first charge storage areas disposed adjacent to each of the plurality of first photoelectric conversion elements for storing electric charges photoelectrically converted by the first photoelectric conversion elements; first charge reading means disposed adjacent to the first charge storage area line for reading electric charges stored in the first charge storage area; first transfer means disposed adjacent to the first charge reading means for sequentially transferring the read electric charges to an external circuit; a line of second charge storage areas disposed adjacent to each of the plurality of second photoelectric conversion elements at positions different from the first charge storage area line for storing electric charges photoelectrically converted by the second photoelectric conversion elements; second charge reading means disposed adjacent to the second charge storage area line for reading electric charges stored in the second charge storage area; second transfer means disposed adjacent to the second charge reading means for sequentially transferring the read electric charges to an external circuit; first charge draining means disposed adjacent to each charge storage area of the first charge storage area line for draining electric charges in the first charge storage area; and second charge draining means disposed adjacent to each charge storage area of the second charge storage area line for draining electric charges in the second charge storage area.

The photoelectric conversion element line with first and second photoelectric conversion elements for generating color signals is provided with the first and second charge draining means for draining electric charges stored in the photoelectric conversion elements, independently for the first and second photoelectric conversion elements. Accordingly, the charge storage time or integration time can be controlled independently for the first and second photoelectric conversion elements.

It is possible to independently set an optimum integration time of each color and generate a color signal with an improved S/N ratio.

BRIEF DESCRIPTION OF THE DRAWINGS

FIG. 4 show signal waveforms illustrating the operation of the embodiment shown in FIG. 1.

FIG. 7 show signal waveforms illustrating the operation of the embodiment shown in FIG. 6.

DETAILED DESCRIPTION OF THE PREFERRED EMBODIMENTS

Figure 10:
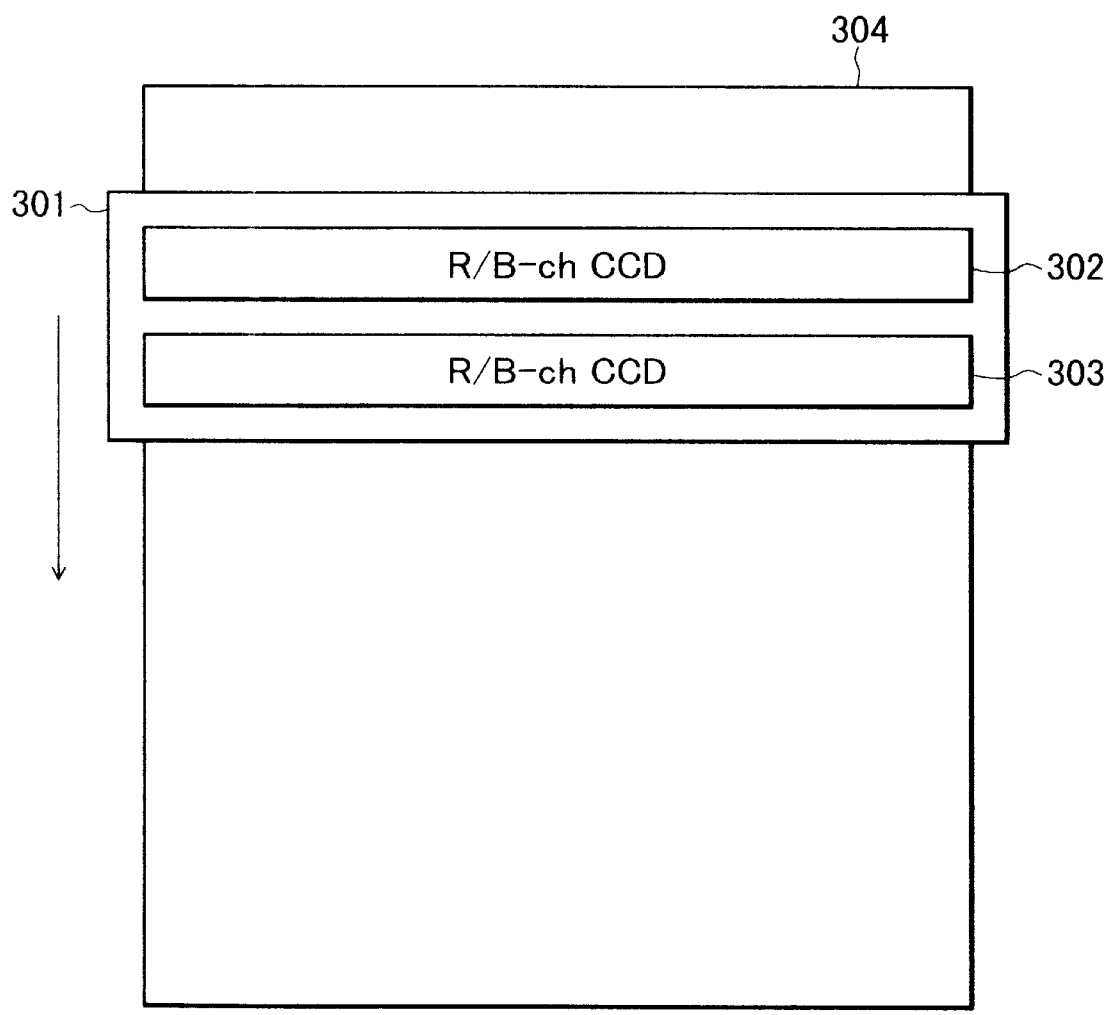
FIG. 10 is a plan view showing a solid image pickup device and a subject.

FIG. 10 is a schematic diagram showing a solid state image pickup device 301 and a subject 304, according to an embodiment of the invention. The solid state image pickup device 301 is, for example, a color image scanner (image reader, image sensor) and has an R/B-ch line sensor 302 and a G-ch line sensor 303. The subject 304 is, for example, a printed sheet. The subject 304 is fixed and the solid state image pickup device 301 is moved on the subject 304 to scan the subject and obtain two-dimensional image signals corresponding to the subject 304. Conversely, the solid state image pickup device 301 may be fixed and the subject 304 is moved.

Figure 1:
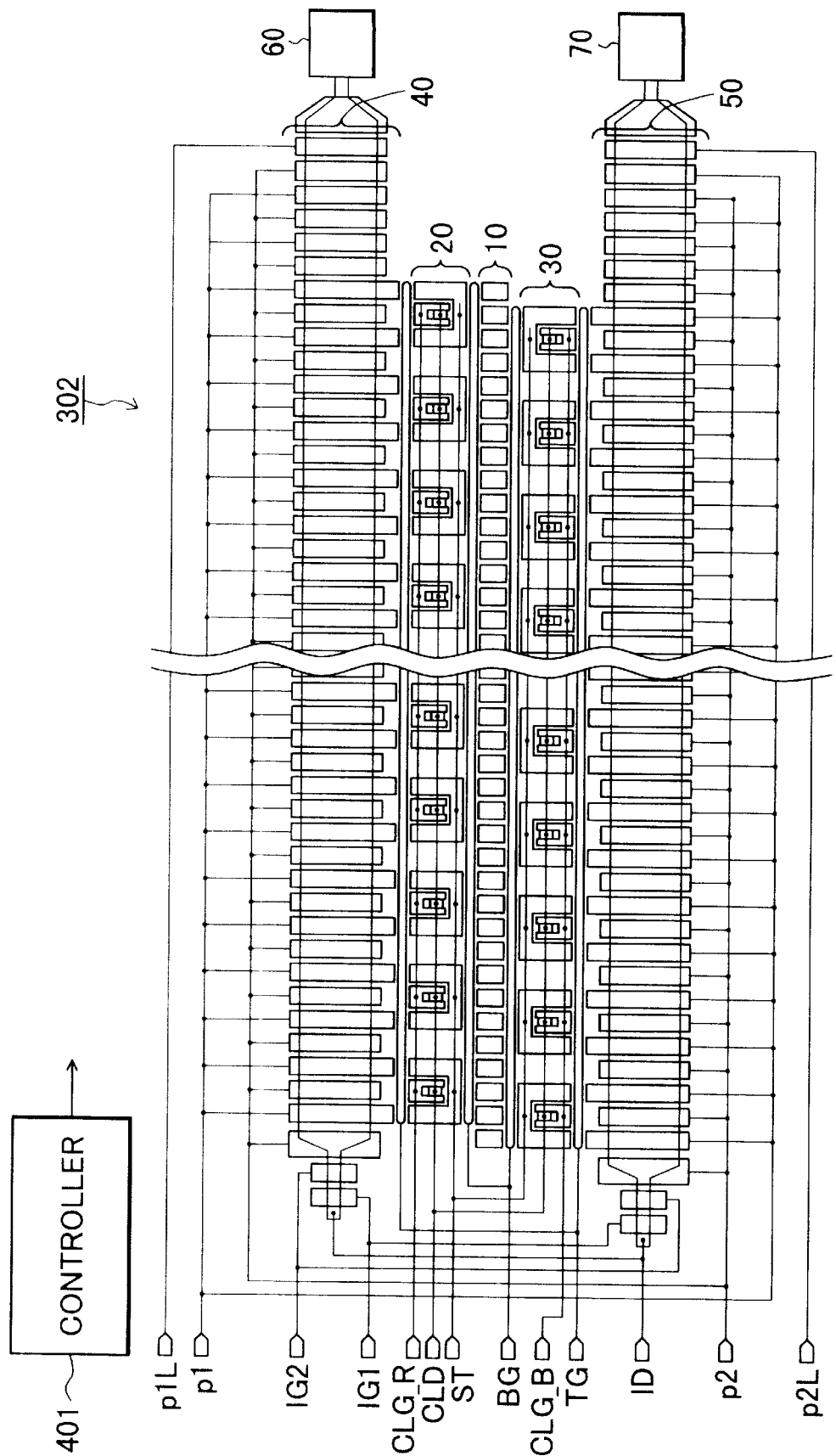
FIG. 1 is a plan view of an R/B-ch line sensor of a solid state image pickup device according to an embodiment of the invention.
Figure 2:
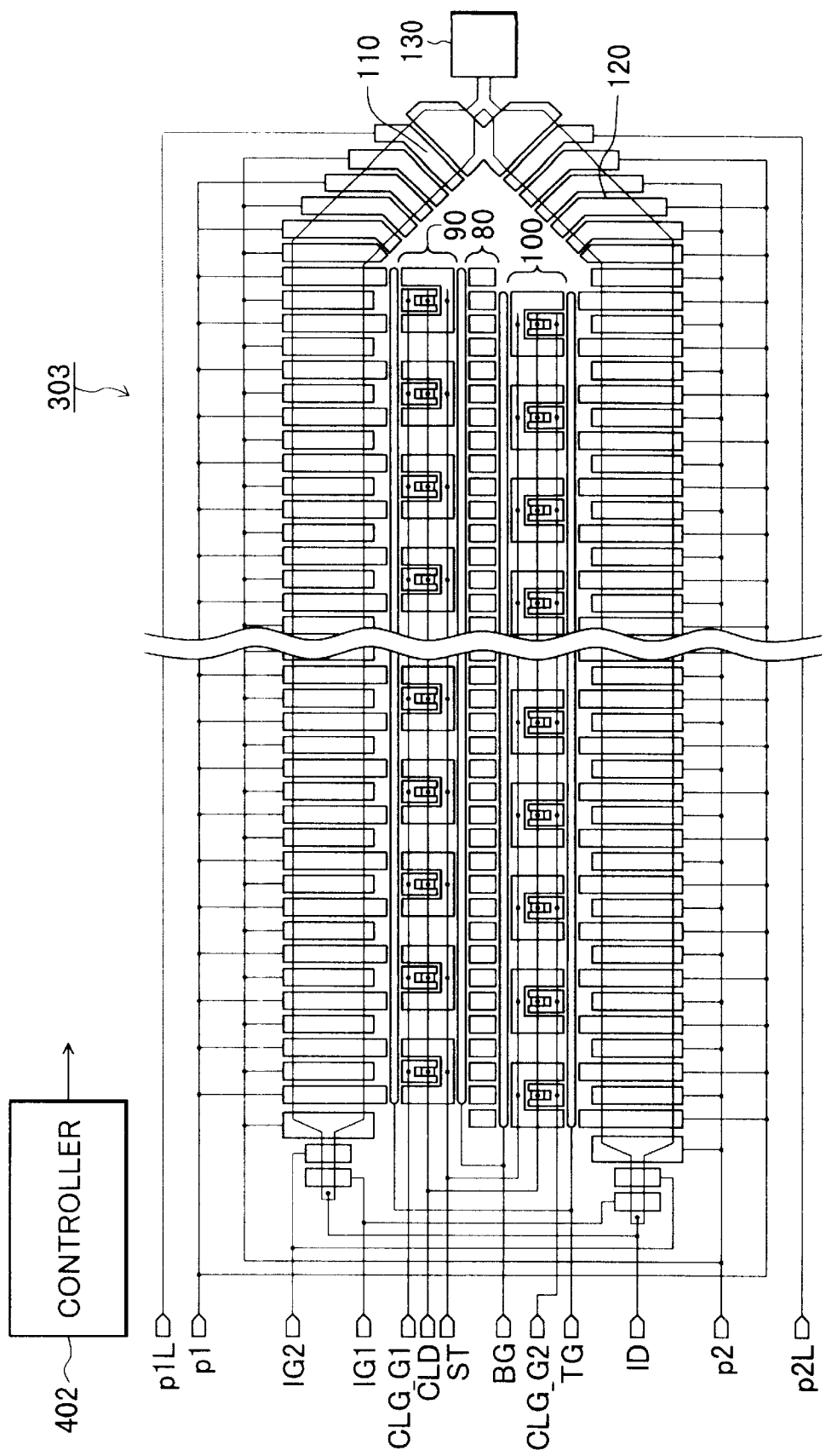
FIG. 2 is a plan view of a G-ch line sensor of the solid state image pickup device of the embodiment.

FIG. 1 is a plan view of the R/B-ch line sensor (hereinafter called a CCD) 302 and FIG. 2 is a plan view of the G-ch CCD 303.

In the R/B-ch CCD 302 shown in FIG. 1, a photodiode unit 10 is disposed in the central area. The photodiode unit 10 has a plurality of photodiode elements (light reception sensors (pixels)) disposed laterally as indicated by rectangular blocks. Red and blur color filters (not shown) are alternately disposed on light reception surfaces of the photodiodes of the photodiode unit 10. For example, the color filters are disposed so that pixels at even columns become sensitive to red light and pixels at odd columns become sensitive to blue light. As shown in FIG. 1, the R/B-ch CCD is of a two-line distribution form distributing charges in the upper and lower directions.

Charge storage units 20 and 30 are disposed adjacent to upper and lower sides of the photodiode unit 10 shown in FIG. 1. The upper charge storage unit 20 accumulates charges of R pixels, and the lower charge storage unit 30 accumulates charges of B pixels. A transfer register unit 40 is disposed on the upper side of the upper transfer register unit 20, and a transfer register unit 50 is disposed on the lower side of the lower transfer register unit 30. The upper transfer register unit 40 transfers charges of R pixels to an output stage 60, and the lower transfer register unit 50 transfers charges of B pixels to an output state 70. The output stage 60 amplifies an image signal corresponding to the charge amounts of R pixels and outputs it, and the output stage 70 amplifies an image signal corresponding to the charge amounts of B pixels and outputs it. The above-described operations are controlled by a controller 401.

The charge storage units 20 and 30 are disposed in a position relation substantially symmetrical to a center line axis of the photodiode unit 10. The transfer register units 40 and 50 are also disposed in a position relation substantially symmetrical to the center line axis of the photodiode unit 10.

The term "position relation substantially symmetrical" is intended to include a shift in the horizontal direction by an amount corresponding to one photodiode of the photodiode unit 10. More specifically, the position relation substantially symmetrical includes the case wherein the charge storage units 20 and 30 are shifted in the horizontal direction by an amount corresponding to one charge storage area and the case wherein the transfer register units 40 and 50 are shifted in the horizontal direction by an amount corresponding to one transfer register area.

In the G-ch CCD 303 shown in FIG. 2, a photodiode unit 80 is disposed in the central area. The photodiode unit 80 has a plurality of photodiode elements (light reception sensors (pixels)) disposed laterally as indicated by rectangular blocks. Green color filters (not shown) are disposed on light reception surfaces of all photodiodes of the photodiode unit 80.

Charge storage units 90 and 100 are disposed adjacent to upper and lower sides of the photodiode unit 80. The upper charge storage unit 90 accumulates charges of G pixels at even columns for example, and the lower charge storage unit 100 accumulates charges of G pixels at odd columns. A transfer register unit 110 is disposed on the upper side of the upper transfer register unit 90, and a transfer register unit 120 is disposed on the lower side of the lower transfer register unit 100. The upper transfer register unit 110 transfers charges of G pixels at the even columns, and the lower transfer register unit 120 transfers charges of G pixels at the odd columns. The charges transferred from the upper and lower transfer register units 110 and 120 are supplied to an output state 130. The output stage 130 amplifies an image signal corresponding to G pixels at even and odd columns and outputs it. The above-described operations are controlled by a controller 402.

As shown in FIG. 10, the two line sensors, R/G-ch CCD 302 shown in FIG. 1 and G-ch CCD shown in FIG. 2, are disposed side by side. Images signals of R, G and B pixels are separated into three series and independently output.

Figure 3:
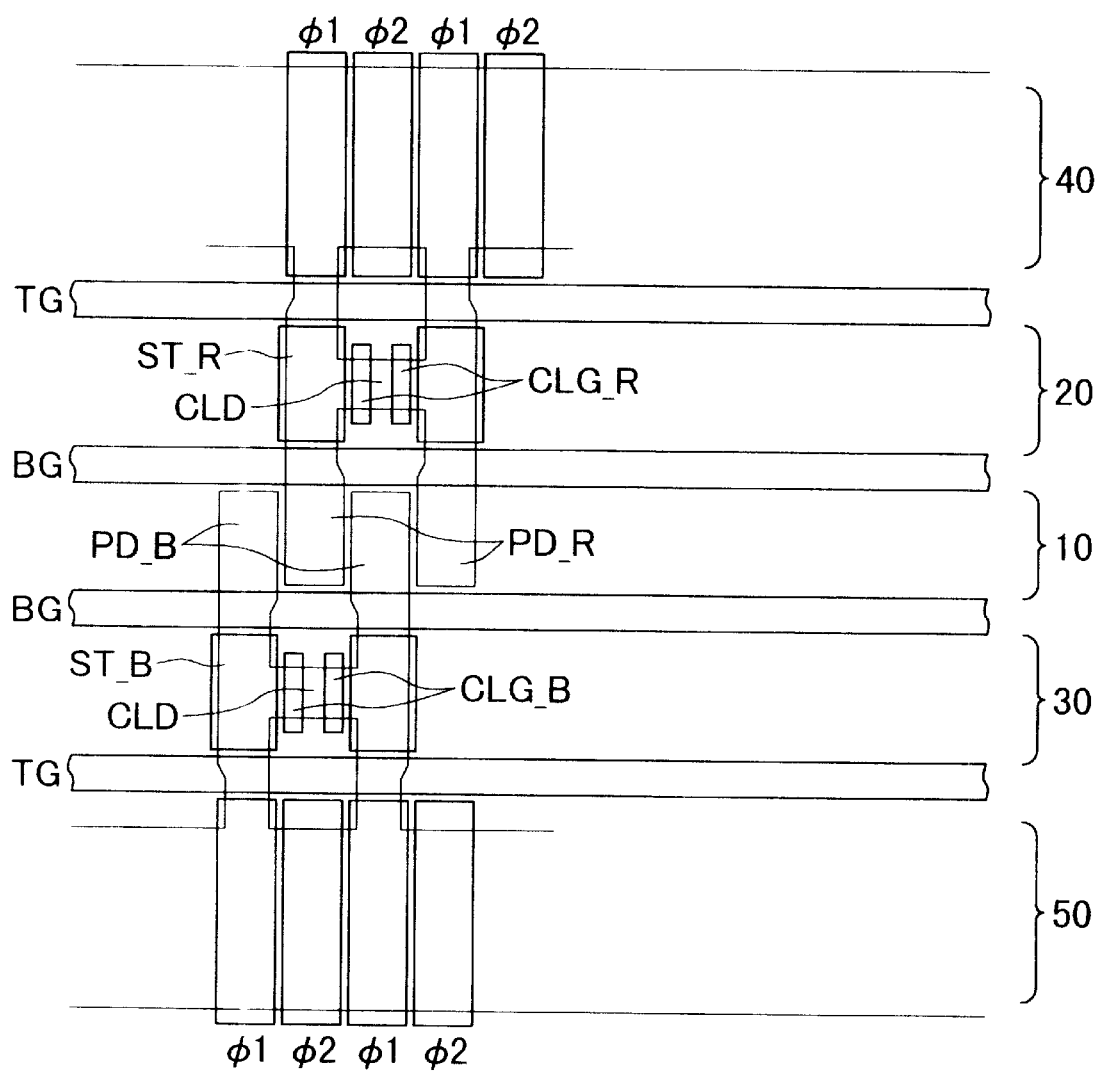
FIG. 3 is an enlarged plan view showing a portion of the R/B-ch line sensor shown in FIG. 1.

FIG. 3 is an enlarged plan view showing a portion of the R/B-ch CCD shown in FIG. 1. In the photodiode unit 10, photodiodes PD_R of R pixels and photodiodes PD_B pixels are alternately disposed side by side. In order to make it easy to understand the structure of the R/B-ch CCD, only four pixels are shown. Each photodiode (photoelectric conversion element) generates charges corresponding to an amount of incidence light.

Charges generated by the photodiodes PD_R and PD_B flow into storage areas ST_R and ST_B of the charge storage units 20 and 30 when upper and lower gates BG are opened. Namely the charges of an R pixel are stored in the storage area ST_R, and the charges of a B pixel are stored in the storage area ST_B.

The storage area ST_R of the charge storage unit 20 and the storage area ST_B of the charge storage unit 30 are provided with respective clear gates CLG_R and CLG_B for drain control of unnecessary charges. When the clear gate CLG_R is opened, charges in the storage area ST_R are drained to a drain CLD. When the clear gate CLG_B is opened, charges in the storage area ST_B are drained to the drain CLD.

Each of the storage areas ST_R and ST_B is provided with a gate TG for transferring the accumulated signal charges to the charge transfer register units 40 and 50. The R transfer register unit 40 is provided with electrodes φ1 and φ2 alternately disposed for transferring R signal charges, and the B transfer register unit 50 is provided with electrodes φ1 and φ2 alternately disposed for transferring B signal charges. As two-phase drive voltages are alternately applied to the electrodes φ1 and φ2, the transfer register units 40 and 50 transfer signal charges.

Figure 5A:
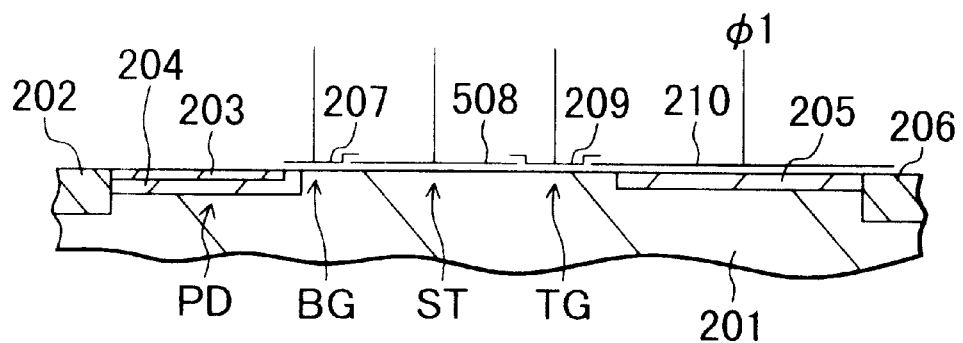
FIGS. 5A to 5F are a cross sectional view of one pixel of the embodiment shown in FIG. 1 and corresponding potential diagrams.

FIG. 4 show signal waveforms illustrating the operation of the embodiment. FIG. 5A is a cross sectional view of one pixel shown in FIG. 1. A photodiode PD, a gate BG, a storage area ST, a gate TG, and an electrode φ1 are formed in a p-type silicon region 201.

In addition to the p-type region 201, the silicon substrate has a p-type region 202, an n-type region 203, an n-type region 204, an n-type region 205 and a p-type region 206. On a first insulating film (e.g., $SiO_2$ film) formed on the surface of the silicon substrate, first polysilicon patterns 208 and 210 are formed. A second insulating film is formed covering the first and second polysilicon patterns 208 and 210, and on this second insulating film, second polysilicon patterns 207 and 209 are formed.

The photodiode PD has the n-type region 203 in the surface layer of the silicon substrate, the n-type region 204 under the region 203, the p-type region 201 under the region 204. When light is applied to the substrate surface, charges are generated. The p-type region 202 prevents charges from being drained from the photodiode PD.

The gate BG has the second polysilicon pattern (conductive layer) 207 formed on the insulating films (e.g., $SiO_2$ film) above the p-type region 201. As a positive potential is applied to the second polysilicon pattern 207, the potential under the gate BG lowers more than that of the photodiode PD so that charges generated in the photodiode PD flow into the storage area ST.

The storage area ST has the first polysilicon pattern (conductive layer) 208 formed on the insulating film above the p-type region 201. As a positive potential is applied to the first polysilicon pattern 208, the storage area is formed in the surface layer of the p-type region 201. As the clear gate CLG (FIG. 3) is opened, charges stored in the storage area ST are drained to the drain CLD (FIG. 3).

The gate TG has the second polysilicon pattern (conductive layer) 209 formed on the insulating films above the p-type region 201. As a positive potential is applied to the second polysilicon pattern 209, the gate TG is opened so that charges stored in the storage area ST are transferred to the n-type region 205 under the transfer electrode φ1. The n-type region 205 corresponds to the transfer register units 40 and 50 shown in FIG. 3.

The transfer electrodes φ1 and φ2 (FIG. 3) are disposed alternately in a direction from the front to the back of the drawing sheet of FIG. 5A. By applying two-phase clocks to the transfer gates φ1 and φ2, charges in the n-type region 205 under the transfer electrode φ1 can be transferred along the direction from the front to the back of the drawing sheet. The p-type region 206 prevents charges in the n-type region 205 under the transfer electrode φ1 from being drained.

Figure 5B:
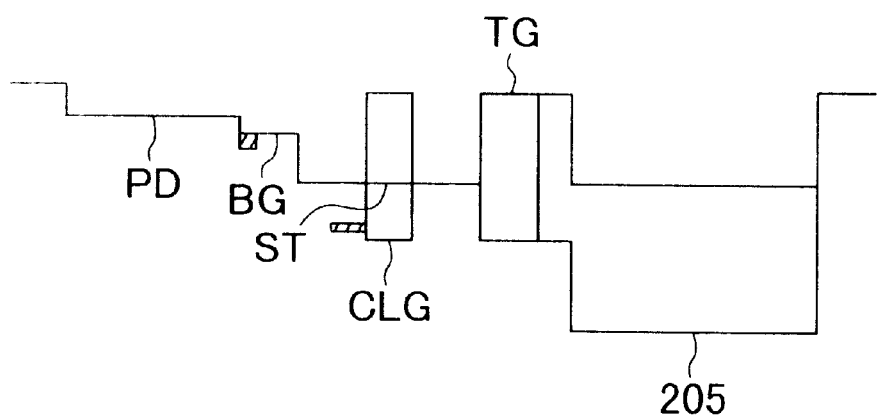

FIG. 5B is a potential diagram showing the operation state that charges are not still generated, the potential diagram showing the operation states at corresponding positions of FIG. 5A. FIGS. 5C to 5F are potential diagrams showing the operation states at corresponding positions of FIG. 5A. The operation of the embodiment will be described with reference to FIGS. 4 and FIGS. 5A to 5F. The operations for R and B pixels are fundamentally the same. In the following description, although the color of a corresponding pixel is not specifically identified, the description is applicable to both R and B pixels. Suffixes R and B at the end of each symbol representing each region are omitted in the following description.

In the state that the clear gate CLG (FIG. 3) is applied with a high level voltage (HI in FIG. 4), the clear gate CLG is ON (opened) so that a channel is formed between the storage area ST and drain CLD. A low level voltage (LO in FIG. 4) is applied to the gate TG so that the gate TG turns OFF (closed).

Figure 5C:
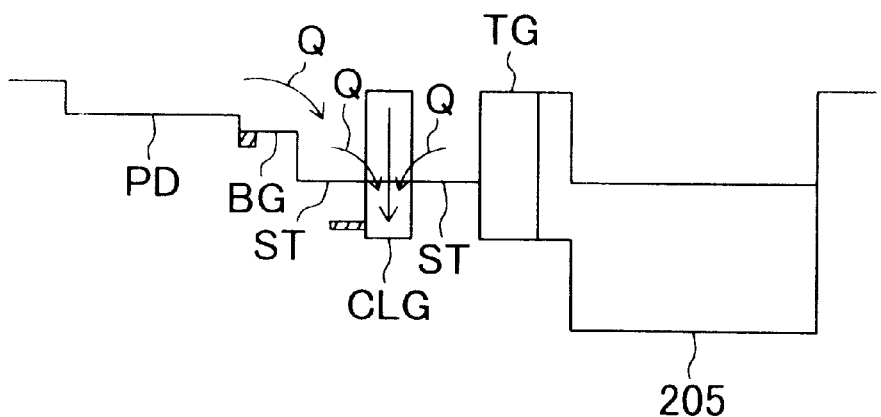

As shown in FIG. 5C, as the gate CLG turns ON, the charges Q flowed from the photodiode PD into the storage area ST are all drained to the drain CLD. Therefore, the storage area ST has no charges and maintains an empty state. Namely, the integration operation at the storage area ST is not performed. This corresponds to the potential state shown in FIG. 5C.

Figure 5D:
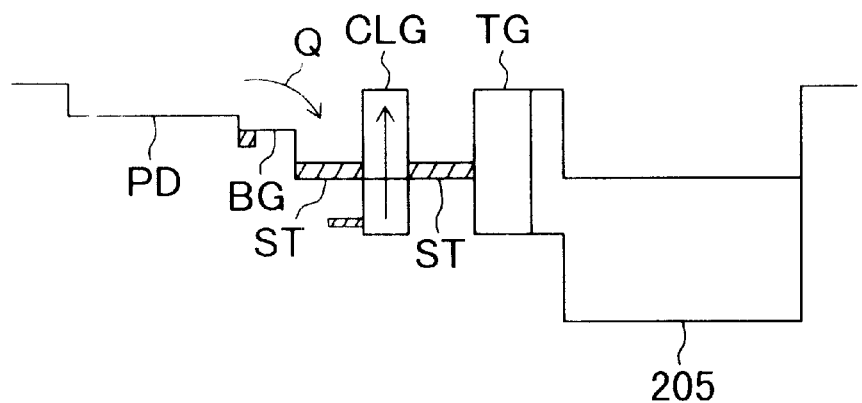
Figure 5E:
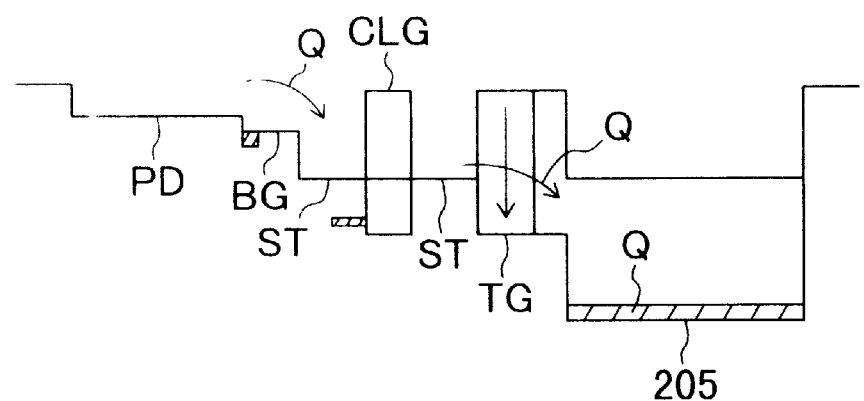

Next, as the clear gate CLG (FIG. 3) is applied with a low level voltage (LO in FIG. 4), the channel between the storage area ST and drain CLD is cut off so that the clear gate CLG turns OFF. As shown in FIG. 5D, the charges Q flowed from the photodiode PD into the storage area ST are all accumulated in the storage area ST. Therefore, timings t1 and t2 when the gate CLG signal (FIG. 4) change from HI to LO are the integration start (charge accumulation start) timings. The timing t1 is the integration start timing for R pixels and the timing t2 is the integration start timing for B pixels. This corresponds to the potential state shown in FIG. 5D.

After a predetermined time lapse, while a high level voltage is applied to the electrode φ1 as shown in FIG. 4, a high level voltage is applied to the gate TG so that the gate TG turns ON. While the high level voltage is applied to the electrode φ1, the low level voltage is applied to the electrode φ2, as shown in FIG. 4. As the gate IG turns ON, the charges Q accumulated in the storage area ST are transferred to the n-type region 205 (transfer register units 40 and 50). The charges Q in the n-type region 205 are shown hatched. A timing t3 when the gate TG signal shown in FIG. 4 falls is the integration end timing for R and B pixels. This corresponds to the potential state shown in FIG. 5E.

Figure 5F:
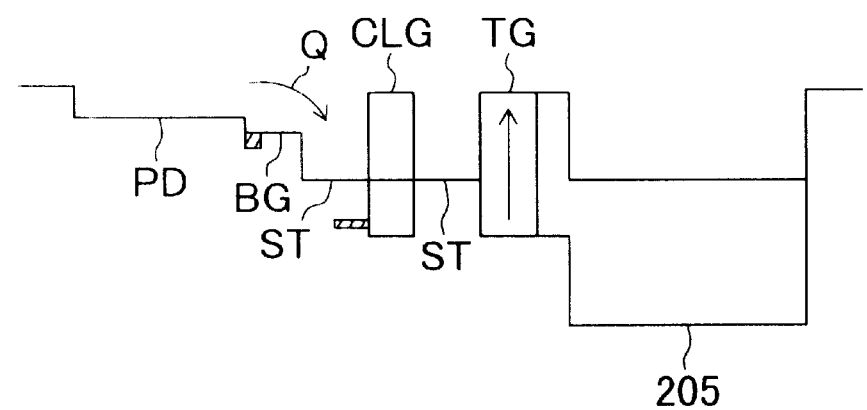

As a low level voltage is applied to the transfer gate TG as shown in FIG. 4, the gate TG turns OFF. As shown in FIG. 5F, as the transfer gate TG turns OFF, a channel between the storage area ST and transfer register unit is cut off. Thereafter, as the two-phase drive pulses are applied to the electrodes φ1 and φ2 as shown in FIG. 4, the charges in the n-type region 205 are transferred along the direction from the front to the bottom of the drawing sheet of FIG. 5A. The transferred charges are output from the output stage 60 or 70 shown in FIG. 1. This corresponds to the potential state shown in FIG. 5F.

In the above operation, the integration time (charge storage time) corresponds to a period from the timing t1 or t2 when the clear gate CLG voltage is turned to the low level to the timing t3 when the transfer gate TG voltage is turned to the low level, i.e., the period indicated by a two-head arrow shown in FIG. 4 (a period TR for R pixels and a period TB for B pixels). After charge accumulation, the charges generated by the photodiode PD are transferred to the transfer register unit 40, 50. After the signal charges are transferred to the transfer register unit 40, 50, the signal charges are sequentially read by the output stage 60, 70 in response to the transfer pulses (pulses having a shorter period shown in FIG. 4) applied to the electrodes φ1 and φ2.

As shown in FIG. 3, in this embodiment, all the clear gates CLG_R for R pixels of the R/B-ch CCD are disposed on the upper side of the photodiodes PD_R, and all the clear gates CLG_B for B pixels are disposed on the lower side of the photodiodes PD_B. As seen from the plan view of the R/B-ch CCD shown in FIG. 1, the clear gates CLR_R for R pixels and clear gates CLR_B for B pixels are controlled by different control signals via metallic wirings. Therefore, it is possible to independently control the fall timings of the voltages applied to the clear gates CLR_R for R pixels and clear gates CLR_B for B pixels, and to set the optimum integration times TR and TB for R and B pixels.

In the G-ch CCD shown in FIG. 2, the same control signals are applied to the clear gates CLG distributed to the upper and lower areas, so that the integration times are the same for the G pixels both at even and odd columns. The other operations of the G-ch CCD are similar to those of the R/B-ch CCD.

As appreciated from the foregoing description of the embodiment, the R/B-ch CCD with alternately disposed R and B pixels is structured to have the two-line distribution form separating the CCD into R and B channels. The clear gates CLG_R and CLG_B capable of independently controlling charge drains of color pixels are provided between the photodiodes PD and transfer register units 40 and 50. It is therefore possible to independently control the integration times of both channels of R and B pixels.

Figure 6:
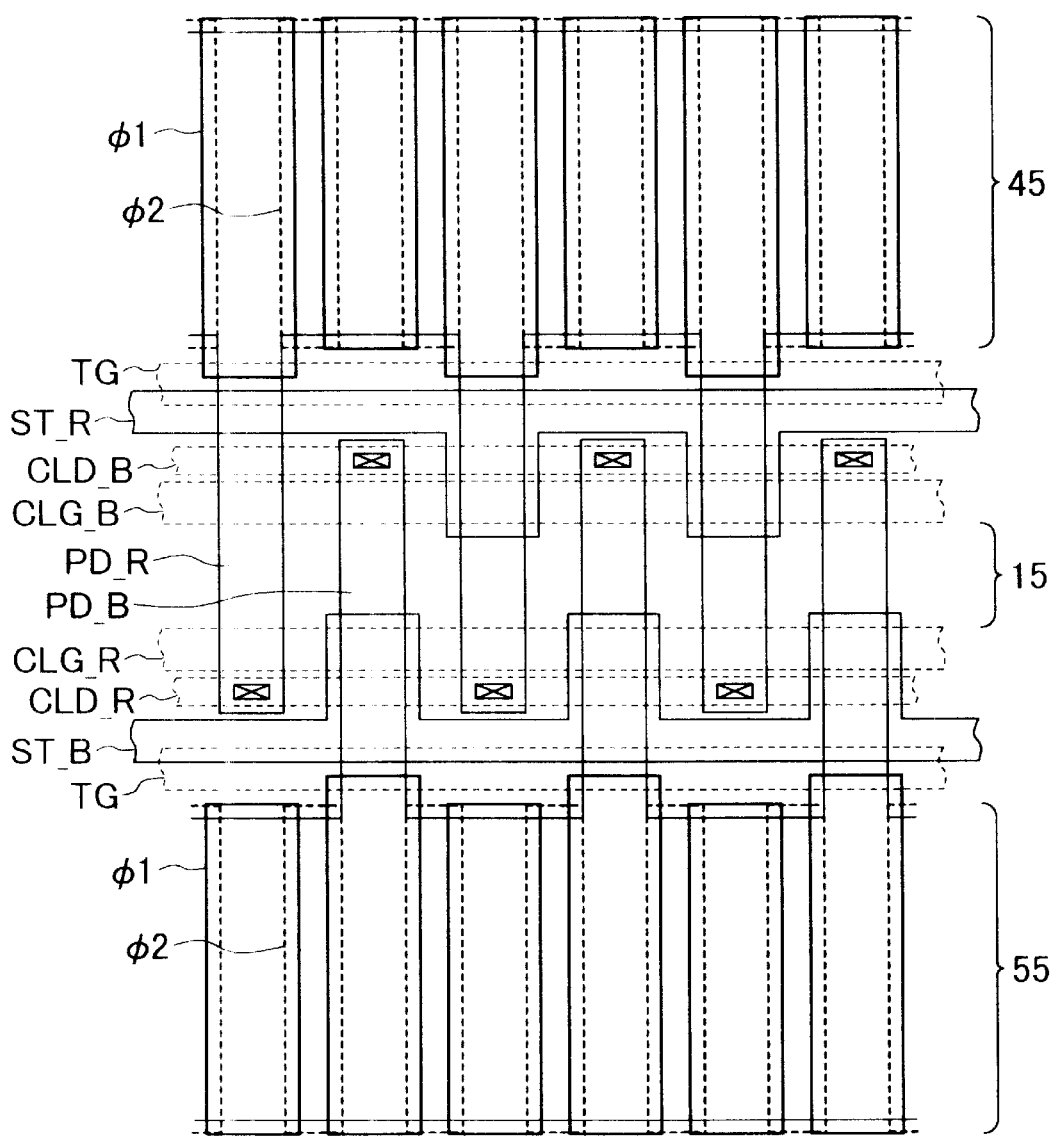
FIG. 6 is a plan view of an R/B-ch line sensor of a solid state image pickup device according to a second embodiment of the invention.
Figure 8A:
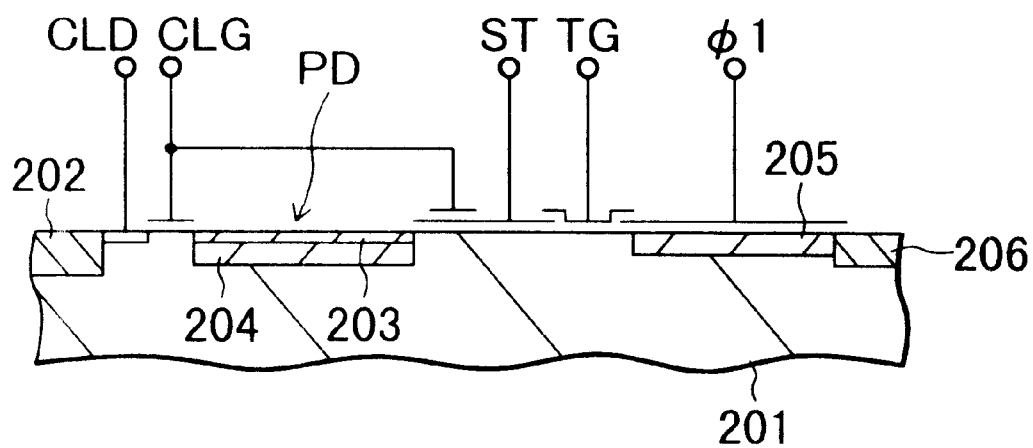
FIGS. 8A and 8B and FIGS. 9A to 9F are cross sectional views of one pixel of the embodiment shown in FIG. 6 and corresponding potential diagrams.
Figure 8B:
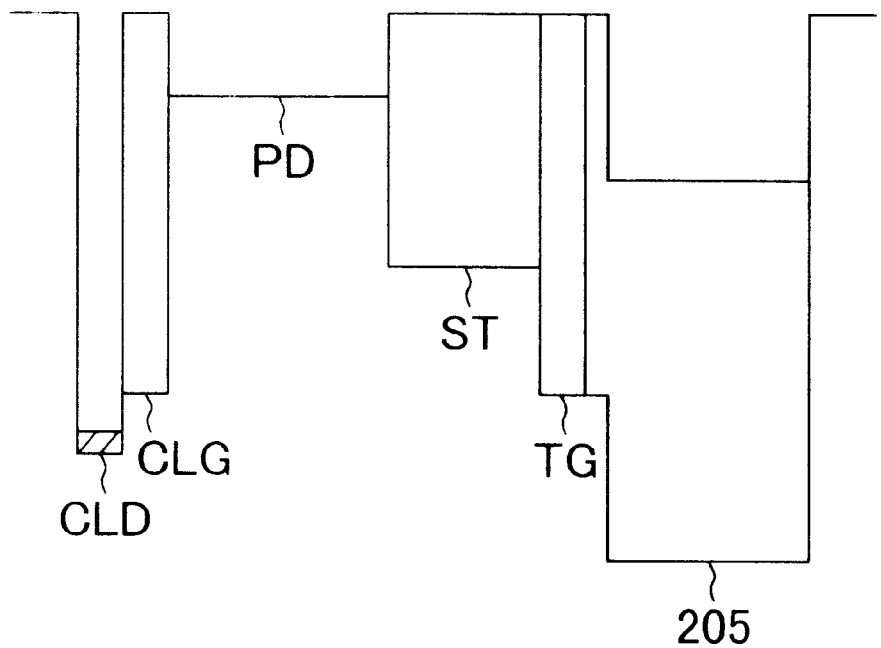
Figure 9A:
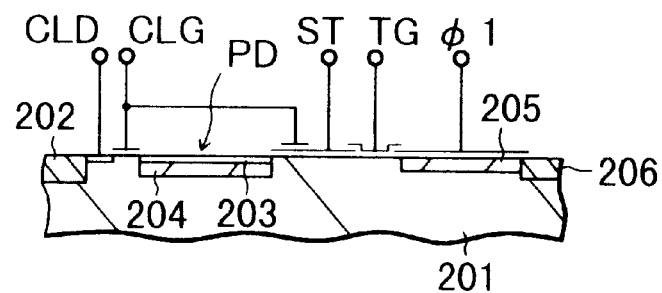

Next, a solid state image pickup device 301 according to a second embodiment of the invention will be described with reference to FIGS. 6 to 9F. FIG. 6 is an enlarged view showing a portion of an R/B-ch CCD 302. FIG. 7 shows waveforms illustrating the operation of the embodiment. FIG. 8A is a cross sectional view of one pixel. FIG. 8B is a potential diagram showing the operation states at corresponding positions of FIG. 8A. FIG. 9A is a cross sectional view of one pixel, and FIGS. 9B to 9F are potential diagrams showing the operation states at corresponding positions of FIG. 9A. In FIG. 8A, regions 201 to 206 correspond to the silicon regions of the same conductivity type shown in FIG. 5A.

Similar to the first embodiment, the R/B-ch CCD of the second embodiment is structured to have the two-line distribution form, as shown in FIG. 6. Signal charges generated by photodiodes PD_R for R pixels are transferred to an upper transfer register unit 45, and signal charges generated by photodiodes PR_B for B pixels are transferred to a lower transfer register unit 55. In the following description, since the operations of the channels of both R and B pixels are fundamentally the same, the suffixes R and B are omitted.

Referring to FIG. 6, first polysilicon patterns (conductive layer) φ1 and ST are indicated by broad solid lines, and second polysilicon patterns (conductive layer) φ2, TG and CLG are indicated by broad broken lines. The second polysilicon patterns φ2, TG and CLG are formed on an insulating film (not shown) which covers the first polysilicon patterns φ and ST.

The clear gate CLG made of the second polysilicon pattern is formed adjacent to a photodiode unit 15. The drain CLD for charge drain is formed adjacent to the clear gate CLG. As shown in FIG. 8A, the clear gate CLG is made of the second polysilicon pattern formed on the insulating film above the p-type region 201.

The storage electrode ST made of the first polysilicon pattern is formed adjacent to the photodiode unit 15. The transfer electrode TG serving as a transfer gate is formed adjacent to the storage electrode ST. As shown in FIG. 8A, the clear gate CLG made of the second polysilicon pattern formed on the insulating film is disposed above the storage electrode ST, in order to drain charges of an adjacent pixel. An influence, of a voltage applied to the clear gate CLG for the adjacent pixel, upon the p-type region 201 can be neglected because the storage electrode ST made of the first polysilicon pattern is disposed under the clear gate CLG.

Therefore, as shown in the cross sectional view of FIG. 8A and the potential diagram of FIG. 8B, the channel potential under the storage electrode ST is not dependent upon the potential of the clear gate CLG, but is determined solely by the potential applied to the storage electrode ST.

As shown in FIG. 6, the photodiodes PD_R of R pixels drain unnecessary charges to the lower clear drains CLD_R via the gates CLG_R, and accumulate necessary drains in the upper storage areas ST_R.

The photodiodes PD_B of B pixels drain unnecessary charges to the upper clear drains CLD_B via the gates CLG_B, and accumulate necessary drains in the lower storage areas ST_B.

The second polysilicon pattern of the clear drain CLD_B extends on the insulating film above the first polysilicon pattern of the storage electrode ST_R. The second polysilicon pattern of the clear drain CLD_R extends on the insulating film above the first polysilicon pattern of the storage electrode ST_B.

The operation of the embodiment will be described with reference to the waveforms shown in FIG. 7 and the cross sectional view and potential diagrams shown in FIGS. 9A to 9F. FIGS. 9B to 9F are the potential diagrams corresponding to the structure shown in FIG. 9A. The structure of FIG. 9A is the same as that shown in FIG. 8A.

Figure 9B:
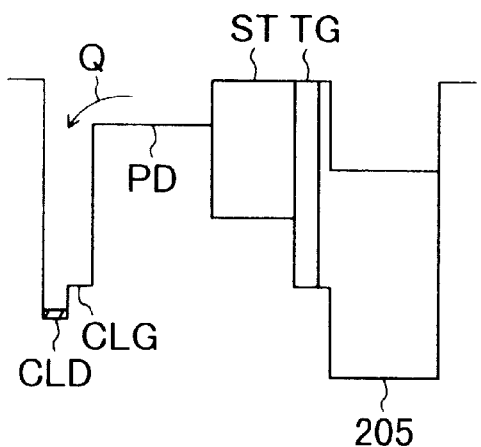

In the state that a high level voltage (5 V in FIG. 7) is applied to the clear gate CLG shown in FIG. 9A, the gate CLG is ON so that a channel is formed between the photodiode PD and drain CLD. Therefore, the charges Q generated by the photodiode PD are all drained to the drain CLD as shown in FIG. 9B. As a low level voltage (0 V in FIG. 7) is applied to the storage electrode ST, the potential of the storage area ST becomes high so that charges are not stored in the storage area ST shown in FIG. 9B and the storage area ST maintains an empty state. Namely, the integration operation is not performed in the storage area ST. This corresponds to the potential state shown in FIG. 9B.

Next, as a low level voltage (0 V in FIG. 7) is applied to the clear gate CLG at a timing t11 shown in FIG. 7, the clear gate CLG turns OFF so that the channel formed under the clear gate CLG is cut off. Therefore, the photodiode PD starts accumulating charges generated therein. This corresponds to the integration start (charge storage start) shown in FIG. 9C.

Figure 9C:
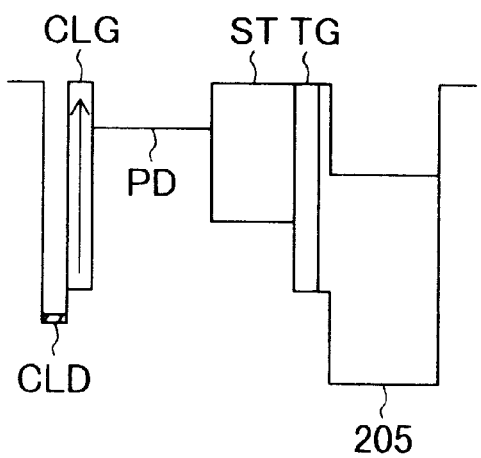
Figure 9D:
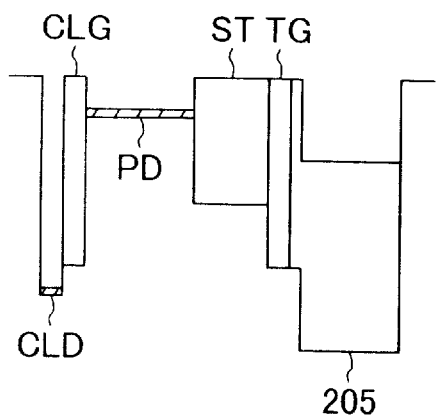

The state shown in FIG. 9C is maintained for a predetermined time TT1. As shown in FIG. 9D, the photodiode PD accumulates the charges Q.

Figure 9E:
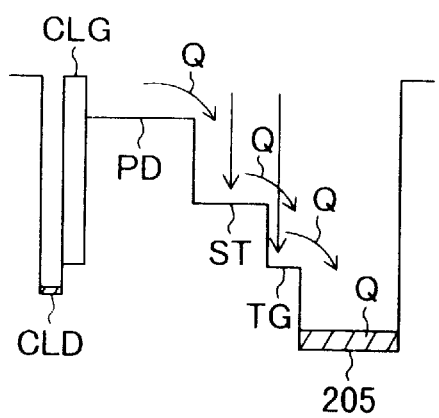

Next, at a timing t12 shown in FIG. 7, while the transfer clock φ1 is maintained in the high level (5 V), high level voltages (3V and 5V) are applied to the storage electrode ST and gate TG. As shown in FIG. 9E, the signal charges Q accumulated in the photodiode PD are therefore transferred to the n-type region 205 (transfer register unit 45, 55) via the storage area ST and an area under the gate TG. This corresponds to the potential state shown in FIG. 9E.

Figure 9F:
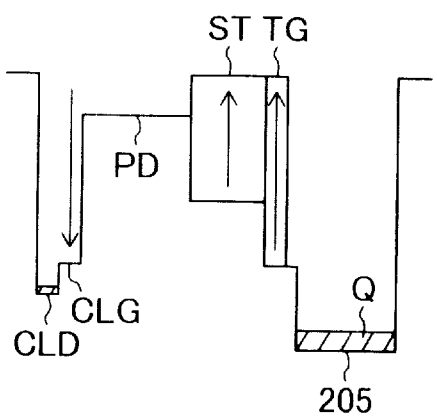

Next, at a timing t13 shown in FIG. 7, a low level voltage is applied to the storage electrode ST and transfer gate TG. As shown in FIG. 9F, the potentials of the storage area ST and an area under the transfer gate TG become high to terminate the integration time. Thereafter, as shown in FIG. 7, two-phase drive pulses (shorter period pulses shown in FIG. 7) are applied to the electrodes φ1 and φ2 to transfer charges from the transfer register unit 45, 55 shown in FIG. 6 to an output stage.

The integration start timing is the timing t11, and the integration end timing is the timing t13. The integration time is t13−t11=TT1+TT2. By independently controlling the gates CLG_R of R pixels and gates CLG_B of B pixels, it becomes possible to independently control the integration times of R and B pixels.

The integration times of R and B pixels may be controlled independently by independently controlling the storage electrodes ST_R and ST_B of R and B pixels and the gates TG.

The same integration time is used for all G pixels of the G-ch CCD, and the structure and operation of the G-ch CCD are similar to those of the R/B-ch CCD.

In the second embodiment described above, both the G-ch CCD and R/B-ch CCD are structured to have the two-line distribution form, and the R and B pixel channels of the R/B-ch CCD are separated into two transfer register units (CCD). It is therefore possible to independently control the integration times of G, R and B pixels.

The present invention has been described in connection with the preferred embodiments. The invention is not limited only to the above embodiments. It is apparent that various modifications, improvements, combinations, and the like can be made by those skilled in the art.

What is claimed is:

1. A solid state image pickup device comprising:
   a photoelectric conversion element line having a plurality of first and second conversion elements disposed alternately, the first and second photoelectric conversion elements converting light having different colors into electric charges;
   first transfer means for transferring electric charges generated by the plurality of first photoelectric conversion elements to an external circuit;
   a first transfer gate for transferring the electric charges generated by the plurality of first photoelectric conversion elements to said first transfer means;
   a first drain for draining unnecessary electric charges generated by the plurality of first photoelectric conversion elements;
   a first drain gate for transferring the unnecessary electric charges generated by the plurality of first photoelectric conversion elements to said first drain;
   second transfer means for transferring electric charges generated by the plurality of second photoelectric conversion elements to an external circuit;
   a second transfer gate for transferring the electric charges generated by the plurality of second photoelectric conversion elements to said second transfer means;
   a second drain for draining unnecessary electric charges generated by the plurality of second photoelectric conversion elements;
   a second drain gate for transferring the unnecessary electric charges generated by the plurality of second photoelectric conversion elements to said second drain; and
   a controller for independently controlling a charge transfer by said first and second transfer gates or by said first and second drain gates.

2. A solid state image pickup device according to claim 1, wherein said controller independently controls a charge transfer by said first and second drain gates.

3. A solid state image pickup device according to claim 1, wherein the first photoelectric conversion element converts light of red color into electric charges, and the second photoelectric conversion element converts light of blue color into electric charges.

4. A solid state image pickup device according to claim 1, wherein said first and second transfer means have a positional relation substantially symmetrical to a center axis of said photoelectric conversion element line.

5. A solid state image pickup device according to claim 1, wherein said controller closes said first drain gate to start accumulating electric charges to be generated by the plurality of first photoelectric conversion elements and closes said first transfer gate to end accumulating electric charges to be generated by the plurality of first photoelectric conversion elements, and closes said second drain gate to start accumulating electric charges to be generated by the plurality of second photoelectric conversion elements and closes said second transfer gate to end accumulating electric charges to be generated by the plurality of second photoelectric conversion elements.

6. A solid state image pickup device according to claim 5, wherein said controller sets a storage time of electric charges to be generated by the first photoelectric conversion element differently from a storage time of electric charges to be generated by the second photoelectric conversion element.

7. A solid state image pickup device according to claim 5, wherein said controller sets a storage start time of electric charges to be generated by the first photoelectric conversion element differently from a storage start time of electric charges to be generated by the second photoelectric conversion element.

8. A solid state image pickup device according to claim 1, wherein said controller sets a storage end time of electric charges to be generated by the first photoelectric conversion element same as a storage end time of electric charges to be generated by the second photoelectric conversion element.

9. A solid state image pickup device according to claim 1, further comprising:
   a first amplifier for amplifying a signal corresponding to an amount of electric charges transferred by said first transfer means; and
   a second amplifier for amplifying a signal corresponding to an amount of electric charges transferred by said second transfer means.

10. A solid state image pickup device according to claim 1, further comprising:
    a plurality of first charge storage areas for storing electric charges generated by the plurality of first photoelectric conversion elements; and
    a plurality of second charge storage areas for storing electric charges generated by the plurality of second photoelectric conversion elements, wherein:
    said first transfer gate is provided between said first charge storage area and said first transfer means and transfers electric charges stored in said first charge storage area to said first transfer means;
    said first drain gate is provided between said first charge storage area and said first drain and transfers electric charges stored in said first charge storage area to said first drain;
    said second transfer gate is provided between said second charge storage area and said second transfer means and transfers electric charges stored in said second charge storage area to said second transfer means; and
    said second drain gate is provided between said second charge storage area and said second drain and transfers electric charges stored in said second charge storage area to said second drain.

11. A solid state image pickup device according to claim 10, further comprising:
    a first barrier gate for transferring electric charges generated by the first photoelectric conversion element to said first charge storage area; and a second barrier gate for transferring electric charges generated by the second photoelectric conversion element to said second charge storage area.

12. A solid state image pickup device according to claim 10, wherein said first and second charge storage areas have a positional relation substantially symmetrical to a center axis of said photoelectric conversion element line.

13. A solid state image pickup device according to claim 10, wherein said first and second transfer means have a positional relation substantially symmetrical to a center axis of said photoelectric conversion element line.

14. A solid state image pickup device according to claim 10, wherein said first charge storage area, said first drain and said first drain gate are provided between said photoelectric conversion element line and said first transfer means, and said second charge storage area, said second drain and said second drain gate are provided between said photoelectric conversion element line and said second transfer means.

15. A solid state image pickup device according to claim 14, wherein said first transfer means is provided on a side opposite to said second transfer means, relative to said photoelectric conversion element line.

16. A solid state image pickup device according to claim 15, wherein said controller closes said first drain gate to start accumulating electric charges to be generated by the plurality of first photoelectric conversion elements and closes said first transfer gate to end accumulating electric charges to be generated by the plurality of first photoelectric conversion elements, and closes said second drain gate to start accumulating electric charges to be generated by the plurality of second photoelectric conversion elements and closes said second transfer gate to end accumulating electric charges to be generated by the plurality of second photoelectric conversion elements.

17. A solid state image pickup device according to claim 16, wherein said controller sets a storage time of electric charges to be generated by the first photoelectric conversion element differently from a storage time of electric charges to be generated by the second photoelectric conversion element.

18. A solid state image pickup device according to claim 16, wherein said controller sets a storage start time of electric charges to be generated by the first photoelectric conversion element differently from a storage start time of electric charges to be generated by the second photoelectric conversion element.

19. A solid state image pickup device according to claim 18, wherein said controller sets a storage end time of electric charges to be generated by the first photoelectric conversion element same as a storage end time of electric charges to be generated by the second photoelectric conversion element.

20. A solid state image pickup device according to claim 1, further comprising:
a plurality of first charge storage areas for storing electric charges generated by the plurality of first photoelectric conversion elements; and
a plurality of second charge storage areas for storing electric charges generated by the plurality of second photoelectric conversion elements, wherein:
said first transfer gate is provided between said first charge storage area and said first transfer means and transfers electric charges stored in said first charge storage area to said first transfer means;
said first drain gate is provided between the first photoelectric conversion element and said first drain and transfers electric charges generated by the first photoelectric conversion element to said first drain;
said second transfer gate is provided between said second charge storage area and said second transfer means and transfers electric charges stored in said second charge storage area to said second transfer means; and
said second drain gate is provided between the second photoelectric conversion element and said second drain and transfers electric charges generated by the second photoelectric conversion element to said second drain.

21. A solid state image pickup device according to claim 20, wherein said first charge storage area is provided between the first photoelectric conversion element and said first transfer means, and said second charge storage area is provided between the second photoelectric conversion element and said second transfer means.

22. A solid state image pickup device according to claim 21, wherein said first drain and said first drain gate are provided between the first photoelectric conversion elements and said second transfer means, and said second drain and said second drain gate are provided between the second photoelectric conversion element and said first transfer means.

23. A solid state image pickup device according to claim 22, wherein said first transfer means is provided on a side opposite to said second transfer means, relative to said photoelectric conversion element line.

24. A solid state image pickup device according to claim 23, wherein said controller closes said first drain gate to start accumulating electric charges to be generated by the plurality of first photoelectric conversion elements and closes said first transfer gate to end accumulating electric charges to be generated by the plurality of first photoelectric conversion elements, and closes said second drain gate to start accumulating electric charges to be generated by the plurality of second photoelectric conversion elements and closes said second transfer gate to end accumulating electric charges to be generated by the plurality of second photoelectric conversion elements.

25. A solid state image pickup device according to claim 24, wherein said controller sets a storage time of electric charges to be generated by the first photoelectric conversion element differently from a storage time of electric charges to be generated by the second photoelectric conversion element.

26. A solid state image pickup device according to claim 24, wherein said controller sets a storage start time of electric charges to be generated by the first photoelectric conversion element differently from a storage start time of electric charges to be generated by the second photoelectric conversion element.

27. A solid state image pickup device according to claim 26, wherein said controller sets a storage end time of electric charges to be generated by the first photoelectric conversion element same as a storage end time of electric charges to be generated by the second photoelectric conversion element.

28. A solid state image pickup device according to claim 15, wherein:
said first and second charge storage areas each have a lamination structure of a first conductive layer, an insulating film, and a charge storage semiconductor region;
said first and second drain gates each have a lamination structure of a second conductive layer, an insulating film, and a semiconductor region;
the second conductive layer forming the first drain gate is formed on the insulating film formed on the first conductive layer forming the second charge storage area; and the second conductive layer forming the second drain gate is formed on the insulating film formed on the first conductive layer forming the first charge storage area.

29. An image sensor having a first line sensor for generating image signals of red and blue colors and a second line sensor for generating image signals of green color, wherein the first line sensor comprising:

a photoelectric conversion element line having a plurality of first and second conversion elements disposed alternately, the first and second photoelectric conversion elements converting light of red and blue colors into electric charges;

first transfer means for transferring electric charges generated by the plurality of first photoelectric conversion elements to an external circuit;

a first transfer gate for transferring the electric charges generated by the plurality of first photoelectric conversion elements to said first transfer means;

a first drain for draining unnecessary electric charges generated by the plurality of first photoelectric conversion elements;

a first drain gate for transferring the unnecessary electric charges generated by the plurality of first photoelectric conversion elements to said first drain;

second transfer means for transferring electric charges generated by the plurality of second photoelectric conversion elements to an external circuit;

a second transfer gate for transferring the electric charges generated by the plurality of second photoelectric conversion elements to said second transfer means;

a second drain for draining unnecessary electric charges generated by the plurality of second photoelectric conversion elements;

a second drain gate for transferring the unnecessary electric charges generated by the plurality of second photoelectric conversion elements to said second drain; and a controller for independently controlling a charge transfer by said first and second transfer gates or by said first and second drain gates.

* * * * *